United States Patent
Wulfekuhle

(10) Patent No.: US 10,998,709 B1
(45) Date of Patent: May 4, 2021

(54) METHOD AND APPARATUS FOR PREVENTING SAME BUILDING SOLAR PANEL PRODUCED VOLTAGE SPIKES ON A NEIGHBOR'S ELECTRIC UTILITY SERVICE

(71) Applicant: Edward Allan Wulfekuhle, Delhi, IA (US)

(72) Inventor: Edward Allan Wulfekuhle, Delhi, IA (US)

( * ) Notice: Subject to any disclaimer, the term of this patent is extended or adjusted under 35 U.S.C. 154(b) by 673 days.

(21) Appl. No.: 15/729,172

(22) Filed: Oct. 10, 2017

Related U.S. Application Data

(60) Provisional application No. 62/406,200, filed on Oct. 10, 2016, provisional application No. 62/428,435, filed on Nov. 30, 2016.

(51) Int. Cl.

| | |
|---|---|
| *G01R 31/327* | (2006.01) |
| *H02H 3/02* | (2006.01) |
| *H02S 99/00* | (2014.01) |
| *H02J 3/38* | (2006.01) |
| *H02H 3/20* | (2006.01) |
| *G01R 21/00* | (2006.01) |
| *H02H 1/00* | (2006.01) |
| *G01R 21/133* | (2006.01) |
| *H02H 3/08* | (2006.01) |
| *G01R 22/06* | (2006.01) |

(52) U.S. Cl.
CPC ........... *H02H 3/025* (2013.01); *G01R 21/007* (2013.01); *G01R 31/327* (2013.01); *H02H 1/0007* (2013.01); *H02H 3/202* (2013.01); *H02J 3/383* (2013.01); *H02S 99/00* (2013.01); *G01R 21/1333* (2013.01); *G01R 22/063* (2013.01); *H02H 3/08* (2013.01)

(58) Field of Classification Search
CPC .......................... G01R 21/1333; G01R 22/063; G01R 22/065; G01R 22/10; G01R 22/06; H02H 3/08; H02H 9/04; H01H 9/54
USPC ............................................. 307/64, 113, 140
See application file for complete search history.

(56) References Cited

U.S. PATENT DOCUMENTS

| | | | | |
|---|---|---|---|---|
| 8,901,772 | B2 * | 12/2014 | Siglock ................... | H02J 3/381 307/65 |
| 2012/0053739 | A1 * | 3/2012 | Brian ...................... | G06F 1/3203 700/287 |
| 2016/0079752 | A1 * | 3/2016 | Matan ....................... | H02J 3/01 307/24 |
| 2016/0223602 | A1 * | 8/2016 | Carlson ................... | G01D 4/004 |

* cited by examiner

*Primary Examiner* — Danny Nguyen
(74) *Attorney, Agent, or Firm* — Simmons Perrine Moyer Bergman PLC

(57) ABSTRACT

A system is disclosed which eliminates problems caused by surges of electric energy which is generated on a utility customer's property and which is fed back onto a utility-owned service line by maintaining a minimum utility provided percentage (MUPP) of power being provided onto a customer-owned dead-end service line. Where the electric energy generated by a utility customer is incrementally excluded from the customer-owned dead-end service line through a plurality of contactors which are controlled by a 120 volt command line.

20 Claims, 20 Drawing Sheets

| Number | Part Number | Description |
| --- | --- | --- |
| 1 | A363008LP | 36 x 30 x 8 Enclosure |
| 2 | A36P30G | Back Panel for Enclosure |
| 3 | R9D4100U | 100A Disconnect |
| 4 | LDB-16-350 | Power Distribution Blocks |
| 5 | XTCE032C10A | 32A Contractors |
| 6 | A202K2CAM | Magnetically Latched Lightning Contractor |
| 7 | 0801733 | DIN Rail |
| 8 | 2903149 | 24VDC Power Supply |
| 9 | QOU110 | QOU Miniature Circuit Breaker, 10A |
| 10 | 3031241 | Gray Feed Through Terminal Block |
| 11 | 3031254 | Blue Feed Through Terminal Block |
| 13 | 2903361 | Relay Module |
| 14 | 2906231 | CT's & Signal Conditioner |
| 15 | 2695439 | T-bus for Signal Conditioner |

FIG. 5B

| Number | Part Number | Description |
|---|---|---|
| 1 | CSD1618 | 16 X 16 X 8 Enclosure |
| 2 | CP1616 | Back Panel |
| 3 | IC755CSS10CDA | 10" HMI Display |
| 4 | EPXMBE001 | Modbus Network Adaptor Module |
| 5 | EP-3468 / EP-8360-A | Analog Input Module |
| 6 | EP-225F | Digital Output Module |
| 7 | EP-125F | Digital Input Module |
| 8 | 0801733 | DIN Rail |

PJ167A
ENTER PART NUMBER

Pin1-Color 1351
Pin2-Color 1353
Pin3-Color 2041
Pin4-Color 2061
Pin5-Color 2081
Pin6-Color 2101
Pin7-Color 2121
Pin8-Color 2141
Pin9-Color 2161
Pin10-Color 2181
Pin11-Color 2201
Pin12-Color 2221
Pin13-Color 2241
Pin14-Color 2261
Pin15-Color 2441
Pin16-Color 2461
Pin17-Color 2481
Pin18-Color 2501
Pin19-Color 2521
Pin20-Color 2541
Pin21-Color 3041
Pin22-Color 3061
Pin23-Color 3081
Pin24-Color 3101
Pin25-Color 3121
Pin26-Color
Pin27-Color
Pin28-Color
Pin29-Color
Pin30-Color
Pin31-Color
Pin32-Color

FIG. 11A

METHOD AND APPARATUS FOR PREVENTING SAME BUILDING SOLAR PANEL PRODUCED VOLTAGE SPIKES ON A NEIGHBOR'S ELECTRIC UTILITY SERVICE

CROSS REFERENCE TO RELATED APPLICATIONS

This application is a non-provisional patent application, which application claims the benefit of the filing date of the provisional patent applications having Ser. No. 62/406,200 filed Oct. 10, 2016, and Ser. No. 62/428,435 filed Nov. 30, 2016, the contents of which are incorporated herein in their entirety by this reference.

FIELD OF THE INVENTION

The present invention generally relates to electrical utilities, and more particularly relates to residential customer use of solar panels on electric utility service lines, and, even more particularly, relates to methods and apparatuses for restricting voltage spikes of electrical energy from a residential customer solar panel on to service lines of a neighbor utilizing the same electric utility.

BACKGROUND OF THE INVENTION

In the past, net metering has been used to provide a use for utility customer generated solar electrical energy at times when the produced energy exceeds the customer's immediate demands. However, such designs could, at least theoretically, result in potentially harmful surges of power being applied to service lines of an electric utility when there happens to be a sudden decrease in consumption at the solar energy producing customer's location. These surges become increasingly problematic as the typical customer solar energy production capacity increases, especially if large scale solar energy sources are net metered in a location where a neighbor's service in is very close to the solar producing customers service line. Unprotected electronic apparatuses, which are highly sensitive to voltage spikes could be damaged by such surges.

While net metering systems may have many advantages in particular applications, they also have some drawbacks. For example, in some situations some electrical customers with solar production may not be liable to other customers for problems caused by the voltage spikes that they generate, or if they are liable they may not be financially sound. In such situations, the electric utility could be the sole source of redress.

Consequently, there exists a need for improved methods and apparatuses for efficiently eliminating the risk of loss caused by voltage spikes produced on an electric utility line by a neighbor's temporary over production of solar energy.

SUMMARY OF THE INVENTION

It is an object of the present invention to provide an easily implemented system for reducing damage caused by voltage spikes from customer solar panels coupled to a utility service line.

It is a feature of the present invention to utilize a real time monitoring of current levels being provided by the utility on a customer's service line of an electric utility, as an input into a solar panel power provisioning control system.

It is an advantage of the present invention to provide for a reduced likelihood of negatively impacting a neighbor's electric utility service by any voltage spikes caused by a customer's solar panel The present invention is an apparatus and method for efficiently and cost effectively providing regulatable methods and system for reducing voltage spikes on an electric service line of a neighbor of a solar energy producing customer, which is designed to satisfy the aforementioned needs, provide the previously stated objects, include the above-listed features, and achieve the already articulated advantages. The present invention is carried out in a "customer solar spike-less" manner, in a sense that voltage spikes caused by surges of solar energy from a nearby solar producer are eliminated or at least greatly reduced.

Accordingly, the present invention is a method of protecting sensitive electronic equipment at a neighboring location by providing solar generated power at a customer-owned dead-end service line comprising the steps of:
  providing a customer side service line downstream from a utility-owned electric meter;
  measuring consumption current through the customer side service line;
  measuring production current representative of electric energy being provided onto said customer side service line from a source other than an electric utility;
  determining if a minimum utility provided percentage (MUPP) is lacking; and
  shutting down a contactor in response to a determination of a lack of sufficient consumption of electric energy through said utility owned electric meter to maintain a MUPP.

Additionally, the present invention is a system of protecting sensitive electronic equipment at a neighboring location by providing solar generated power at a customer-owned dead-end service line comprising:
  a plurality of contactors, each of which is coupled to and receive electrical energy from a source other than through a utility-owned service dead-end line;
  a plurality of utility side current sensor transformers configured to determine an instantaneous amount of electric energy being consumed through a utility-owned electric meter;
  a plurality of customer side current sensor transformers configured to determine an instantaneous amount of electric energy being produced and provided through a source other than through said utility-owned electric meter;
  a programmable logic device configured to send a signal to shut down transmission of energy, from said source other than through said utility-owned electric meter, onto said customer-owned dead-end service line if a reading on one of said plurality of utility side current sensor transformers indicates that a MUPP is lacking.

BRIEF DESCRIPTION OF THE DRAWINGS

The invention may be more fully understood by reading the foregoing description of the preferred embodiments of the invention, in conjunction with the appended drawing wherein:

FIGS. 5A-11B are a detail schematic of an alternate embodiment of the present invention with four 100A contactors.

DETAILED DESCRIPTION

Although described in detail below with particular reference to a residential electric utility service, such as with neighbor's on a street or apartment dwellers in the same building, the present invention is not intended to be limited to such applications. Similarly, it should be understood that solar produced energy is an example of many alternate sources of electrical energy production including wind, hydroelectric, generators powered by combustion of fuels and all other suitable sources. The present invention is not intended to be limited to just solar and these other enumerated sources.

Figure 1:
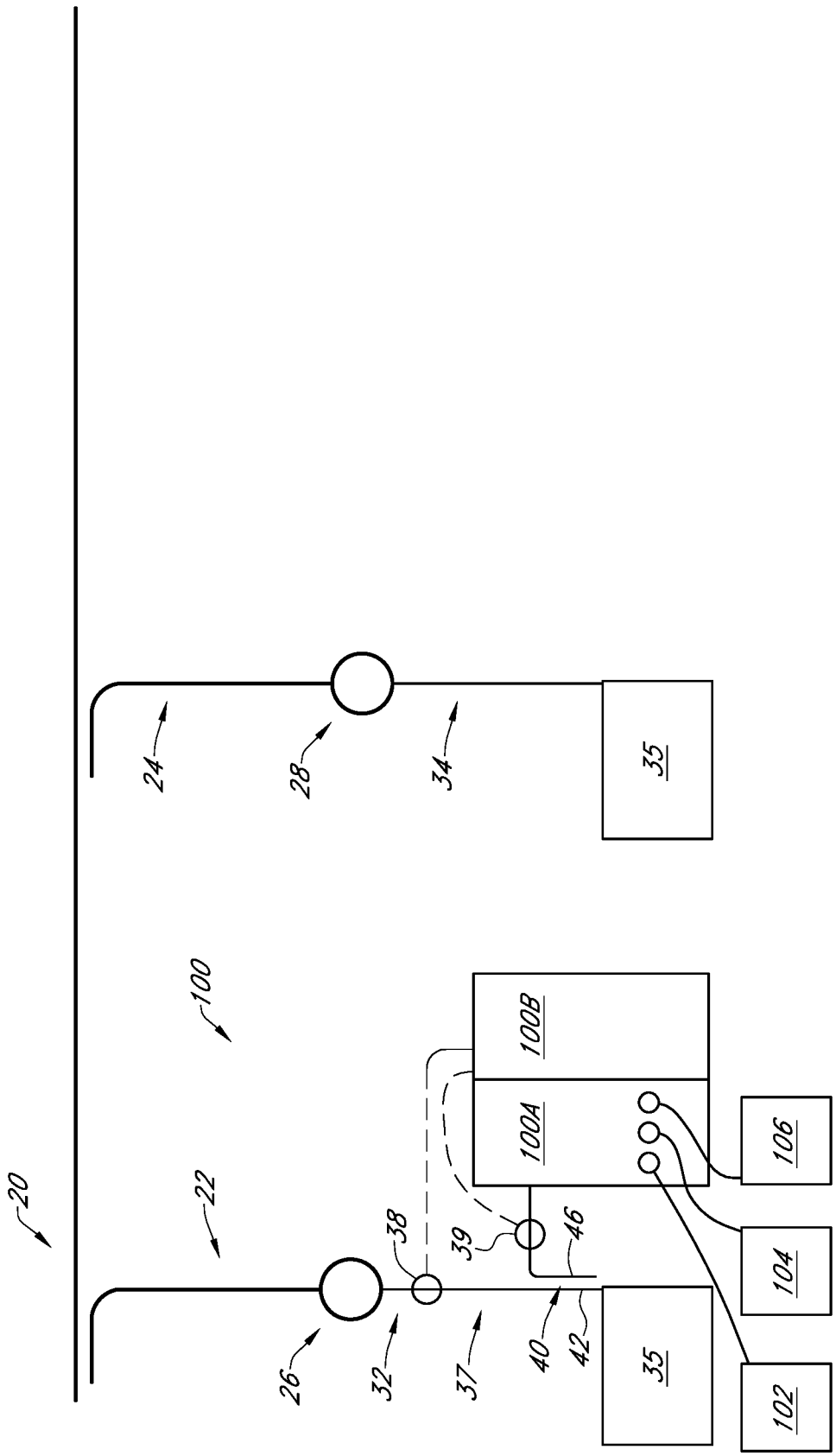
FIG. 1 is a block diagram illustrating a simplified environment including the present invention.

Now referring to FIG. 1, there is shown a system and method for reducing voltage spikes that is implemented in a way that is representative of many different types of environments, which include but are not limited solely to a residential utility customer.

One key aspect is that the present invention is coupled to the electric service by a line tap located on the customer-owned service line between the utility-owned electric meter used by the electric utility to determine consumption for billing purposes and customer appliances etc. which consume electric energy. The customers can be residents, businesses, industrial or agricultural power users or any utility customer that consumes electricity provided by the electric utility.

In an embodiment, the system and method for reducing voltage spikes on a neighbor's customer-owned service line, the hardware implementation of the system and method of the present invention can include any or a combination of the following technologies, which are all well known in the art: electronic circuits, digital and analog circuits, programmable logic devices, computers and other suitable substitutes. The details below should be viewed as examples of many potential variations of the present invention which are protected hereunder.

FIG. 1 is included to explain the environment where the present invention may find optimal utility. FIG. 1 is a block diagram illustrating a simplified electric utility configuration with two homes, each with home wiring 35, which are connected to aerial or buried utility-owned power line 20. The home wiring 35 in one embodiment can be considered to be the wiring in one of several apartments in a multi-unit apartment building where the left side apartment has a solar panel providing an additional source of power to that apartment. In FIG. 1, there is shown a first utility-owned service dead-end line 22 and a second utility-owned service dead-end line 24, each of which respectively ends with the customer side of electric meters 26 and 28. The present invention can be constructed entirely on the customer side 32 of the electric utility meter 26. Much, but not all, of the present invention is implemented in contactor box 100A and communication and control box 100B. Between solar power control system 100 and the tap utility side 42 (still on the customer side of first utility-owned electric service meter 26) is service line T tap 40 for providing the ability for first solar panel assembly 102, second solar panel assembly 104, and third solar panel assembly 106 to provide power to the customer on its normal wiring coming in from the utility. The customer-owned portion of dead-end service line 37 couples with the customer-owned house wiring 35 as is normally done. Solar power control system 100 is provided to the solar producing customer (who would otherwise normally receive utility provided power on first utility-owned dead-end electric service line 22) so that power generated by solar panels 102, 104, 106 cannot result in power being fed (with potential for voltage spikes) back to aerial utility-owned power line 20 and to second utility-owned dead-end electric service line 24 where damage could be done to the neighbor's appliances by solar generated solar spikes.

Figure 3:
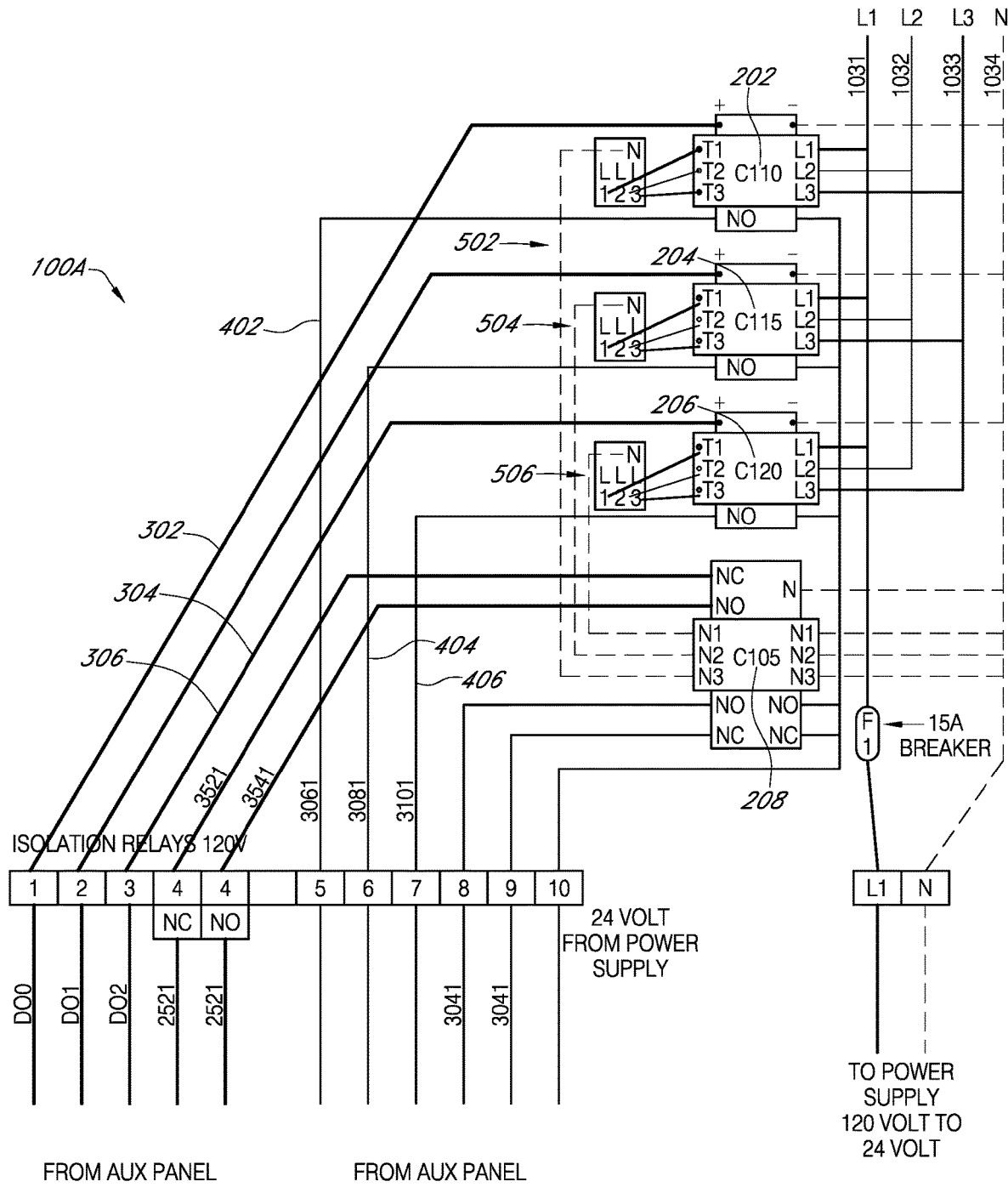
FIG. 3 is a detailed schematic diagram of a contactor portion of the system 100 in FIG. 2.
Figure 4:
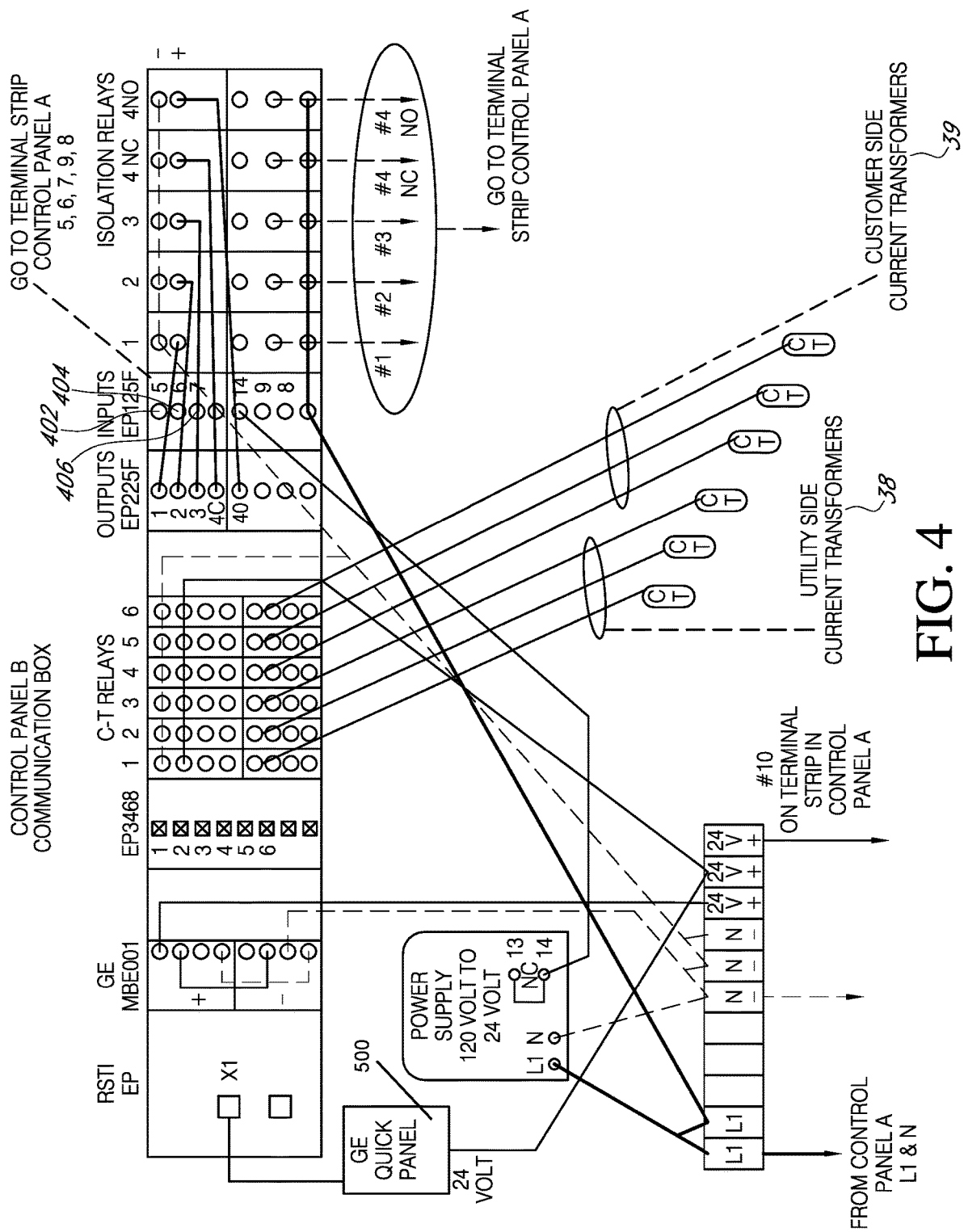
FIG. 4 is a detailed schematic diagram of a communication portion of the system 100 in FIG. 2.
Figure 5A:
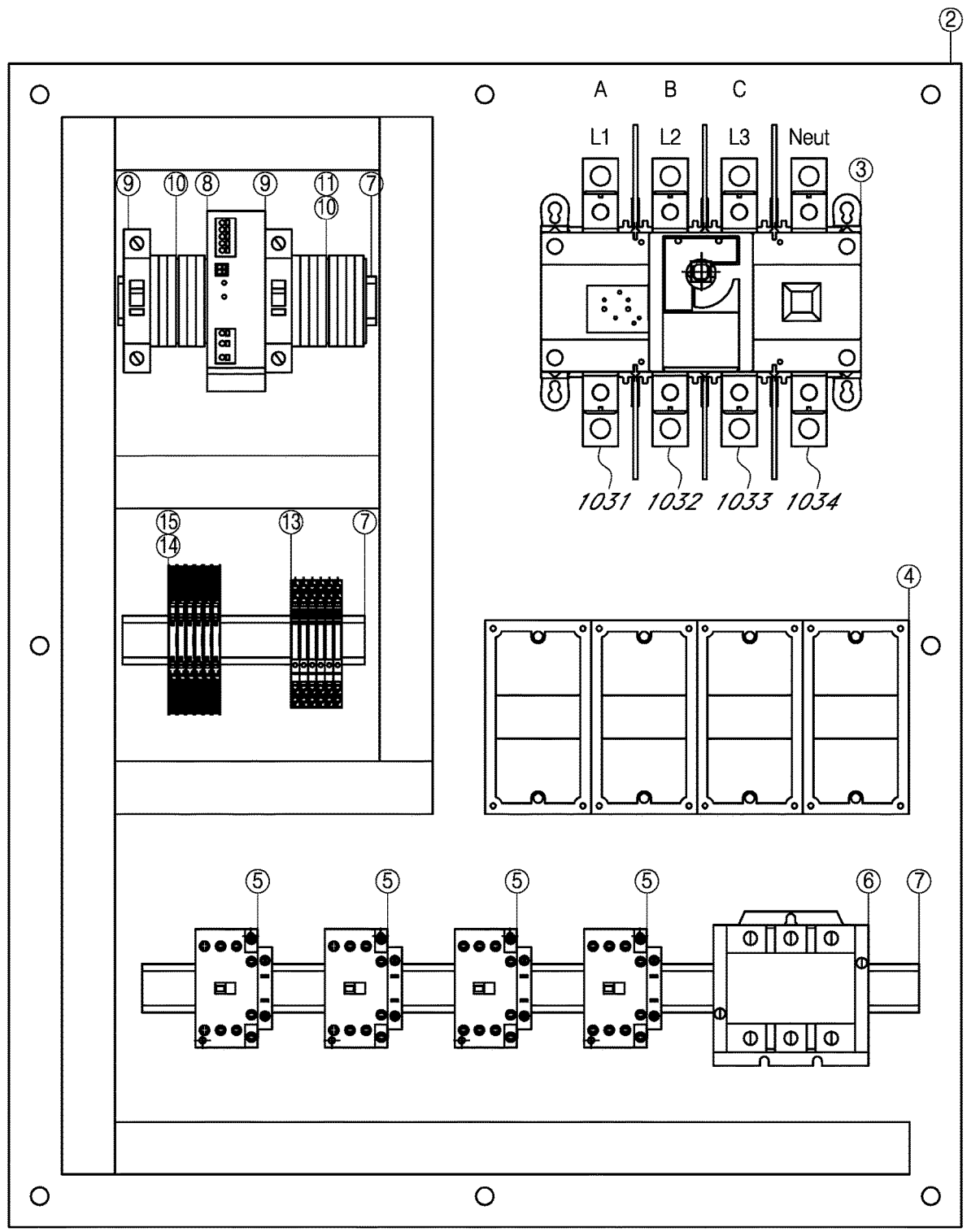
Figure 6:
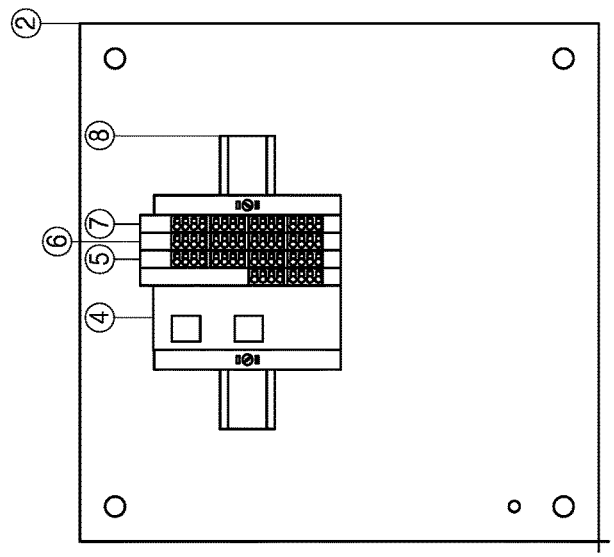
Figure 6:
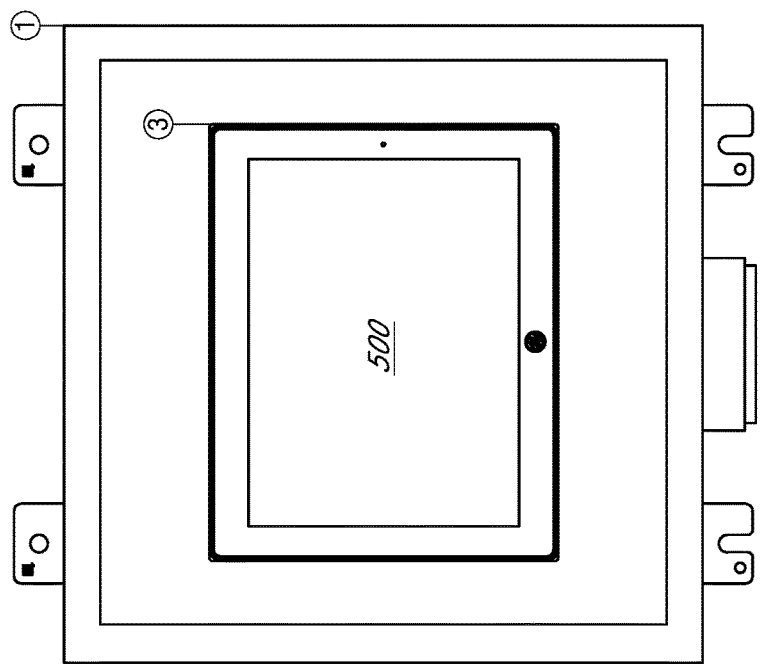
Figure 6:
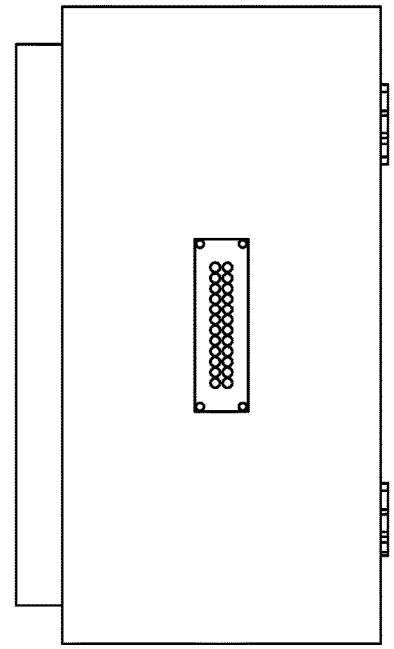
Figure 7:
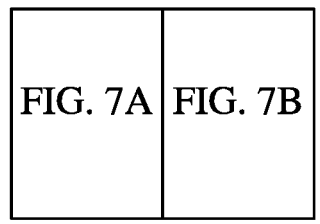
Figure 7A:
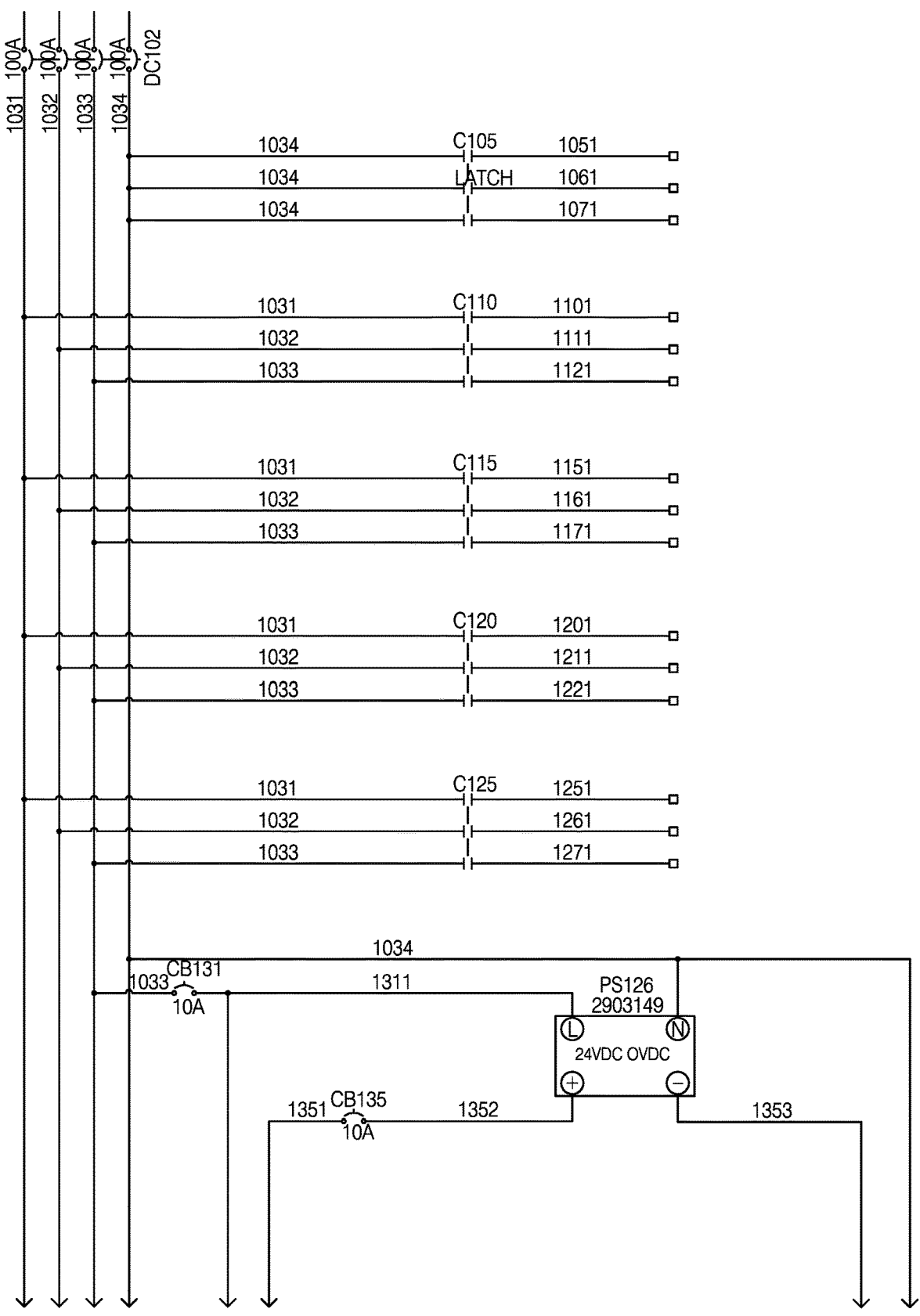
Figure 7B:
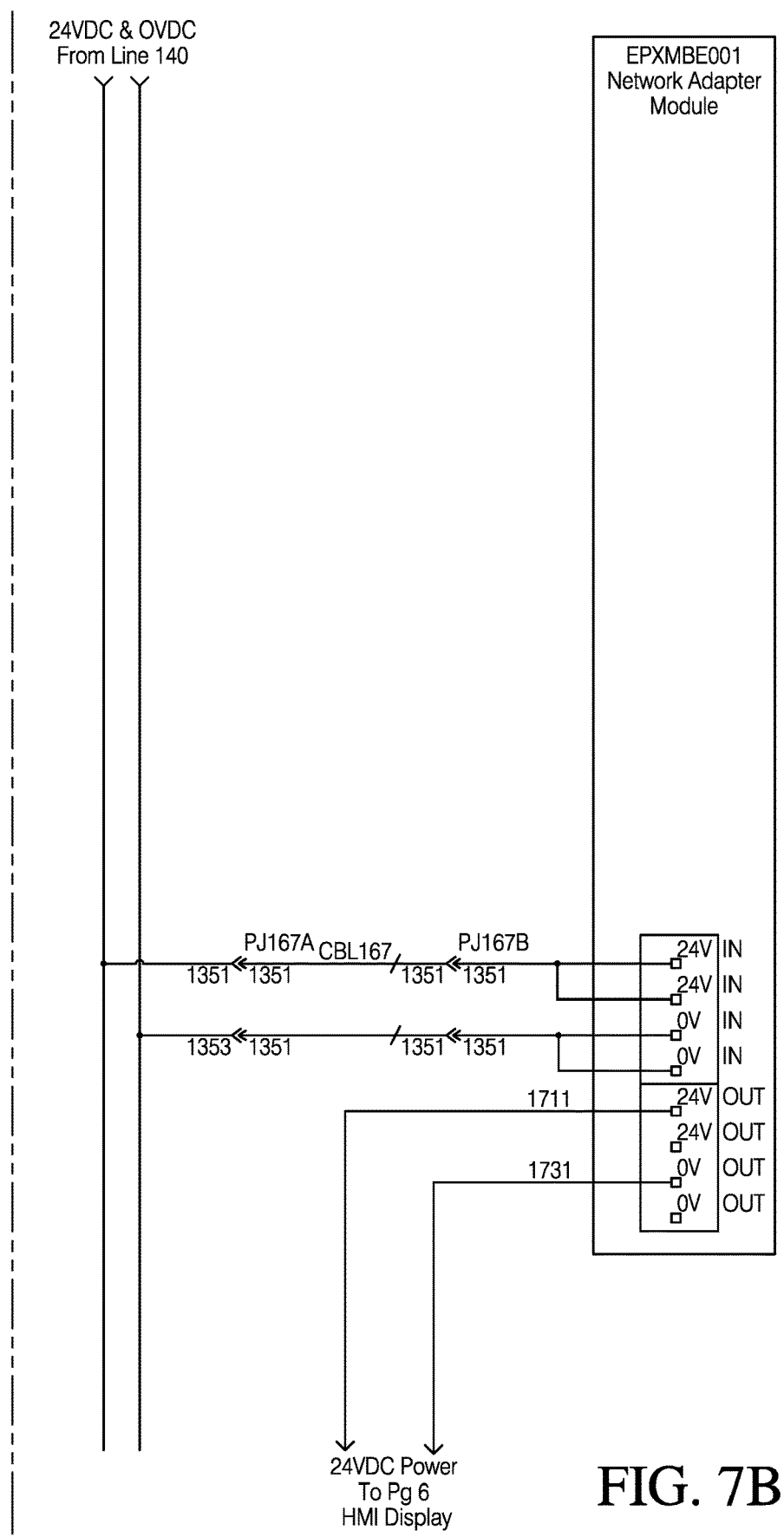
Figure 8:
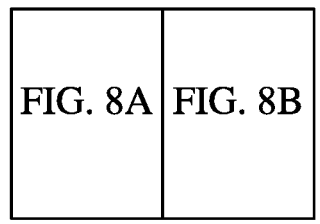
Figure 8A:
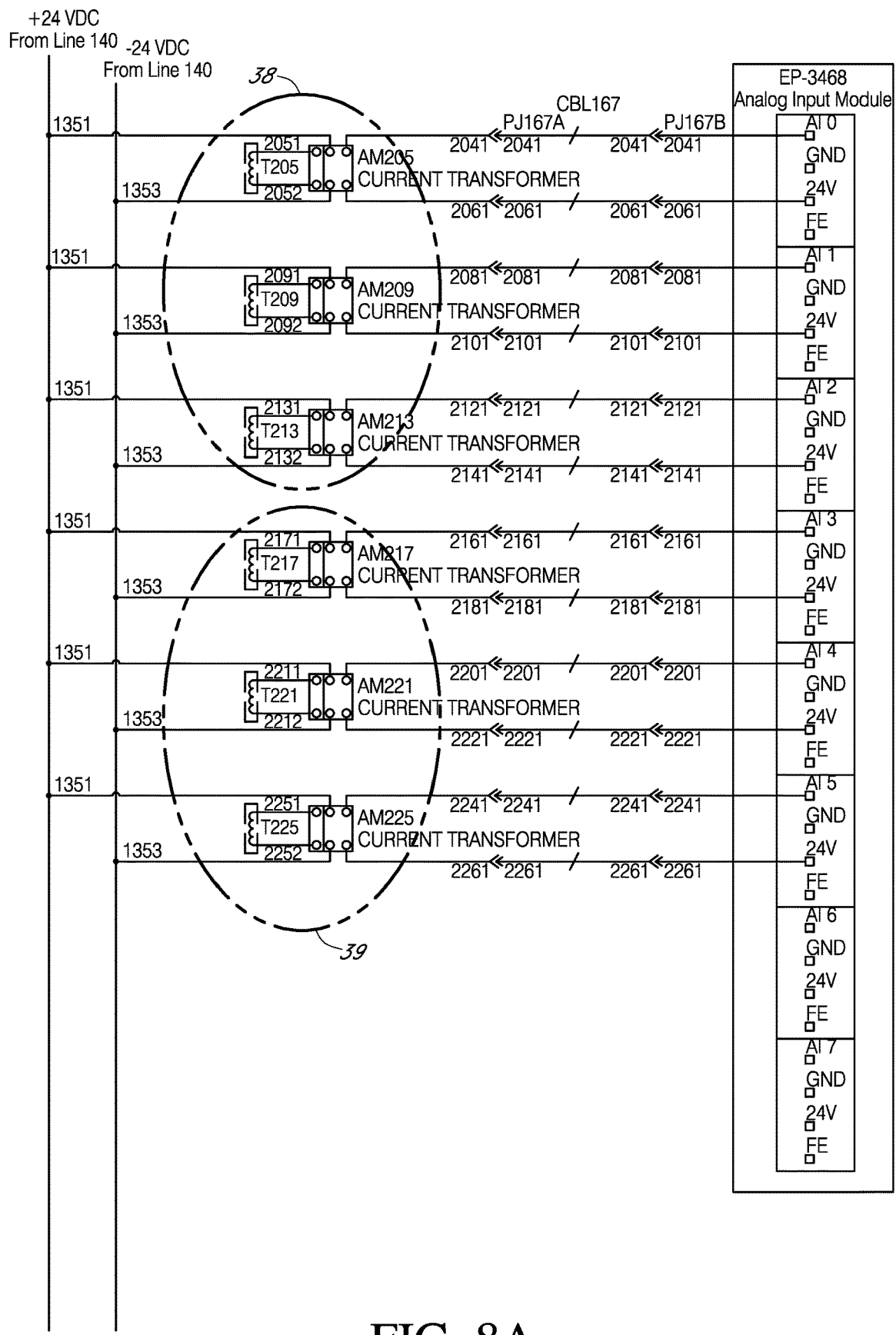
Figure 8B:
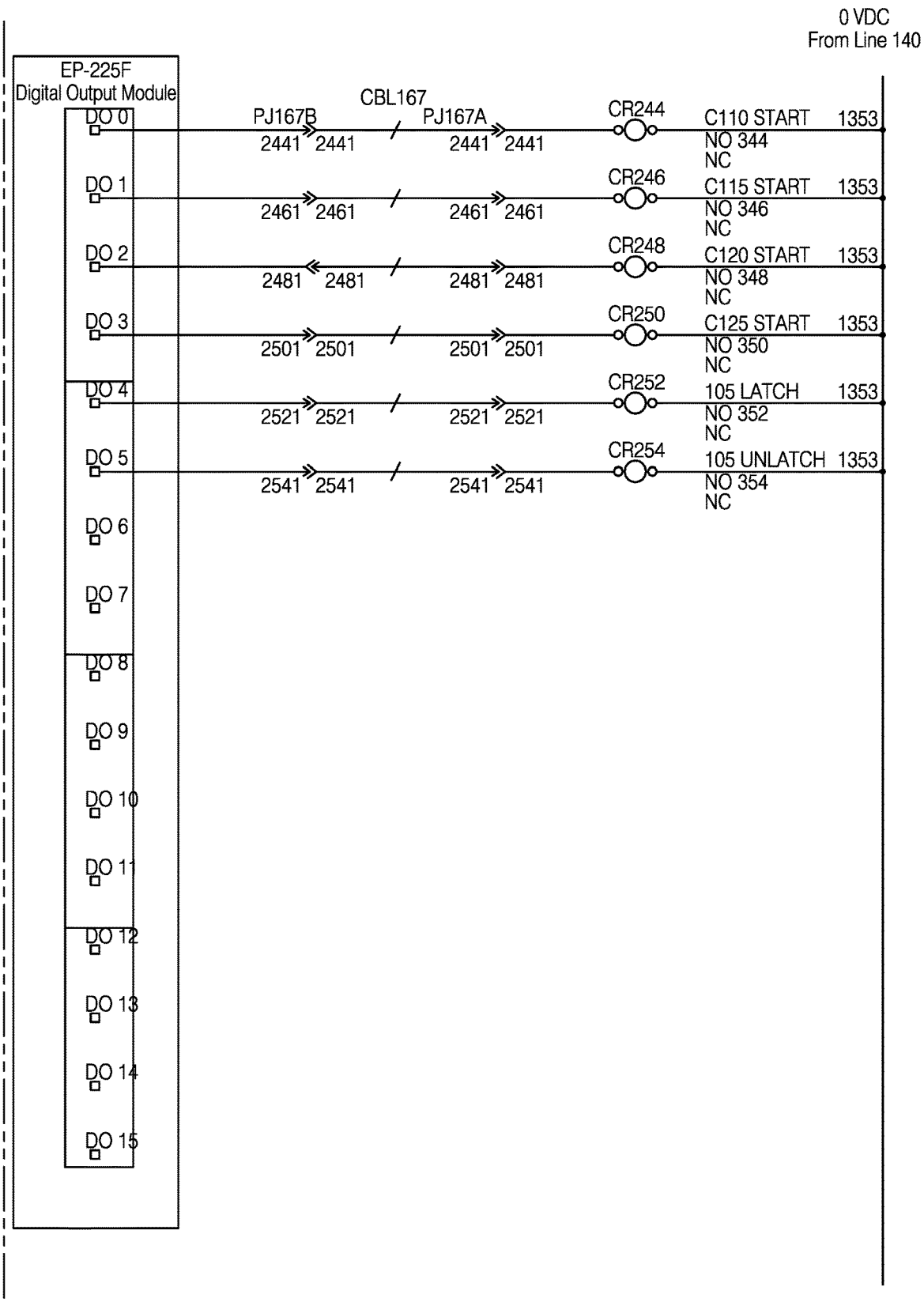
Figure 9:
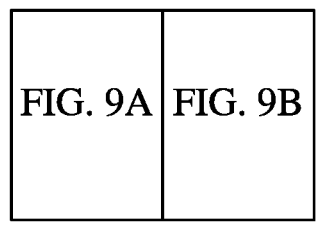
Figure 9A:
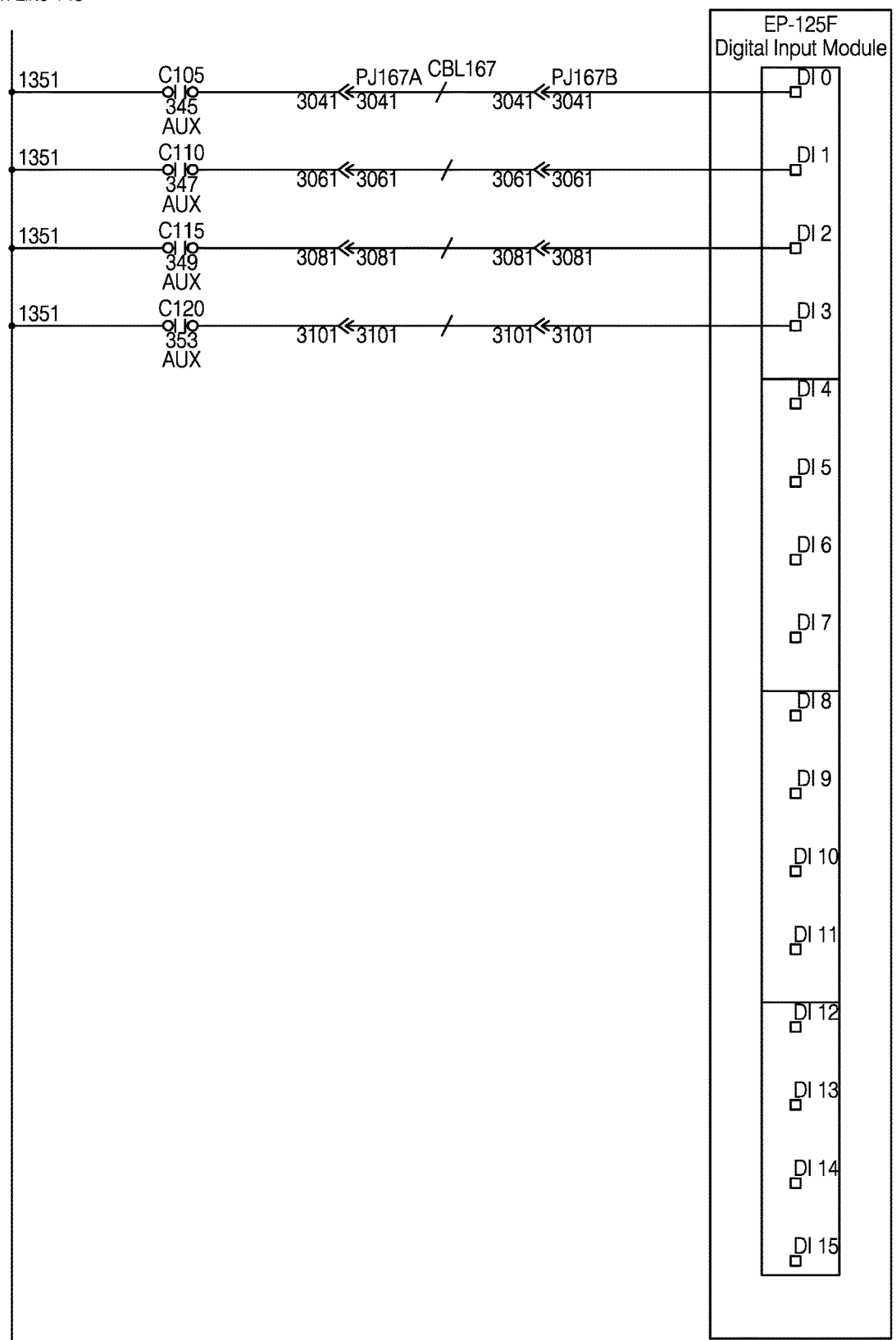
Figure 9B:
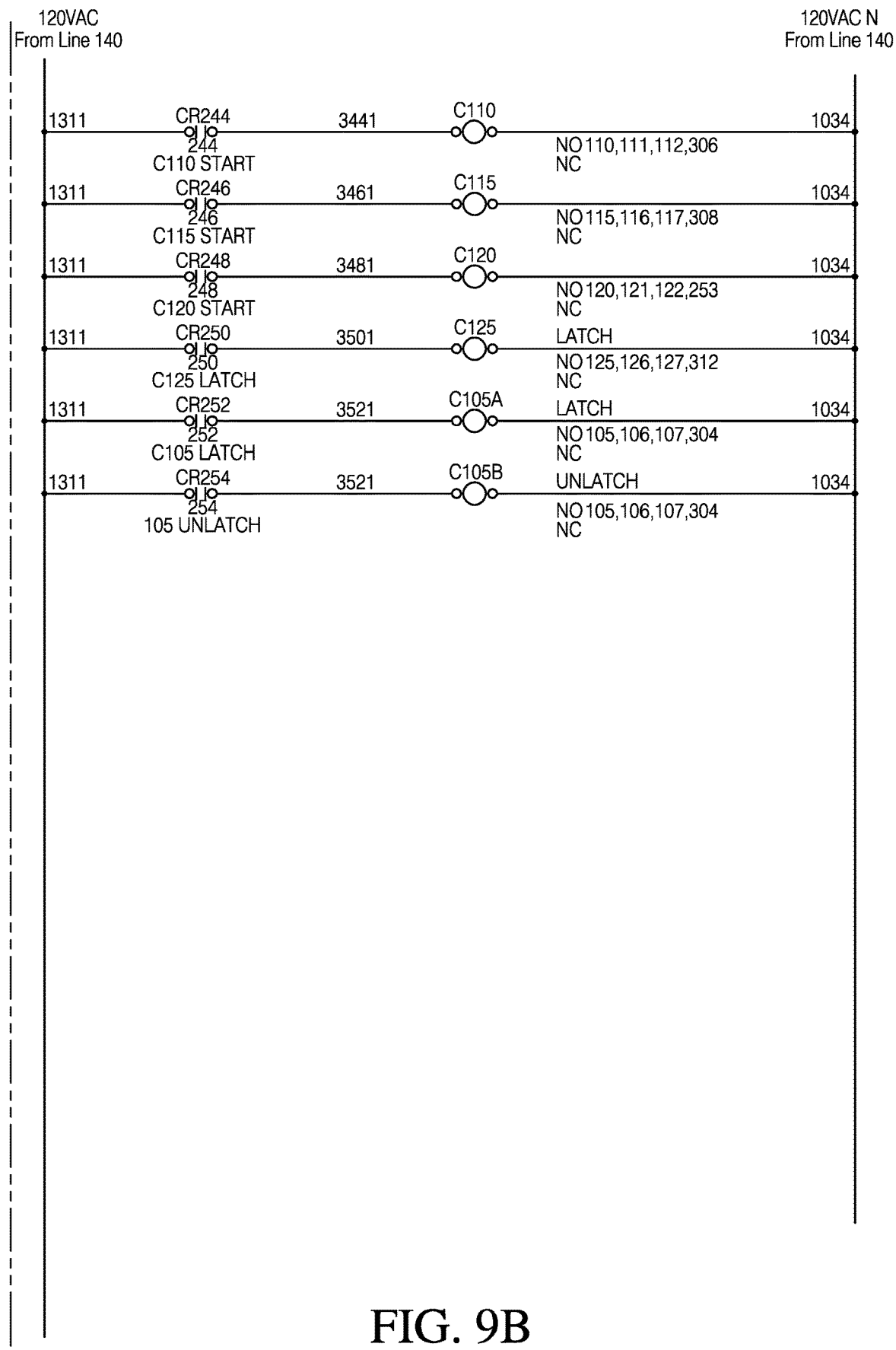
Figure 10:
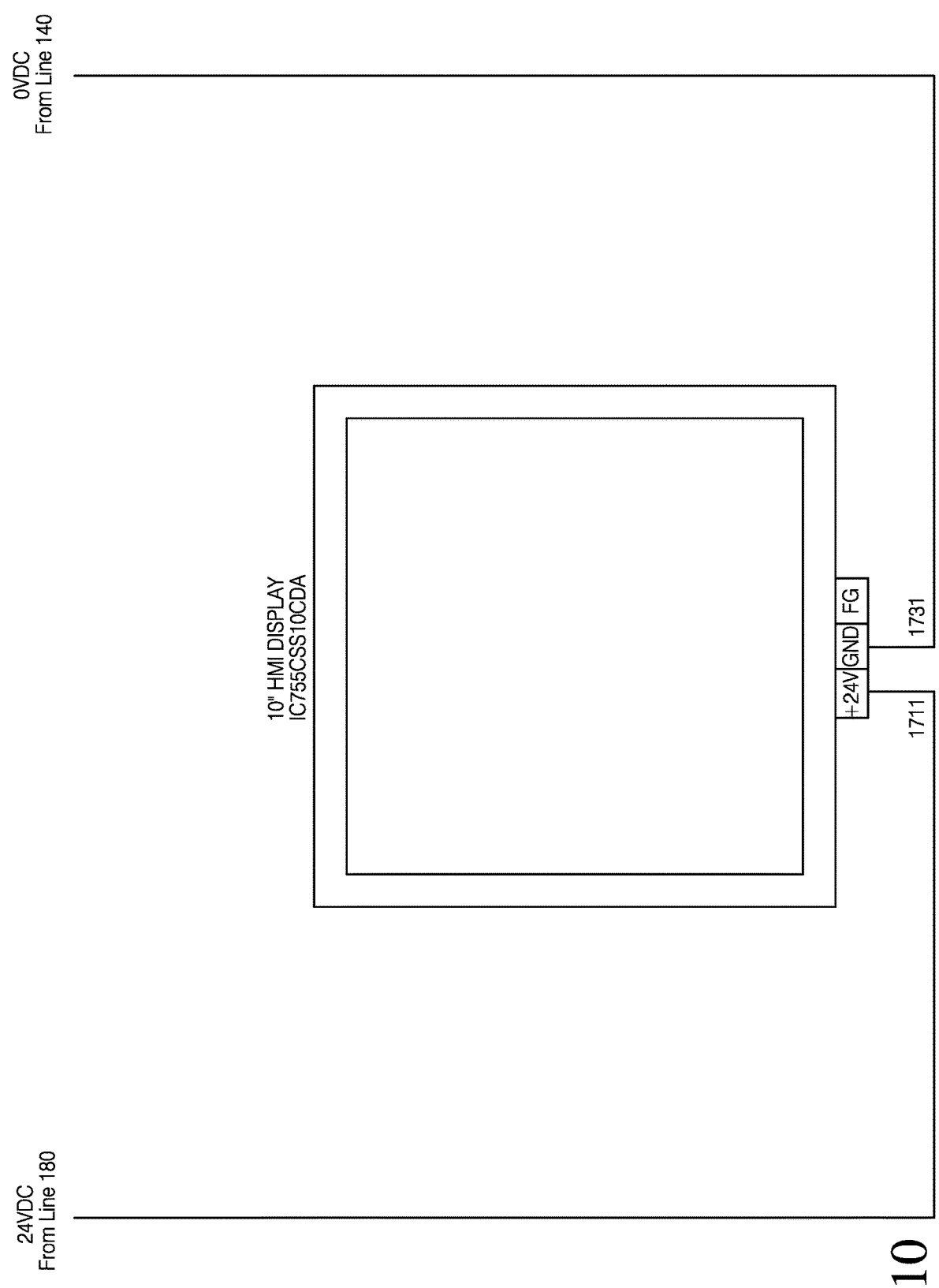
Figure 11:
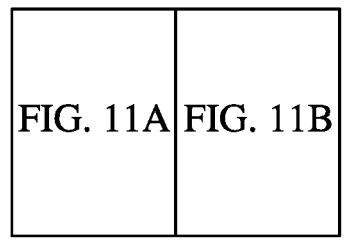
Figure 11B:
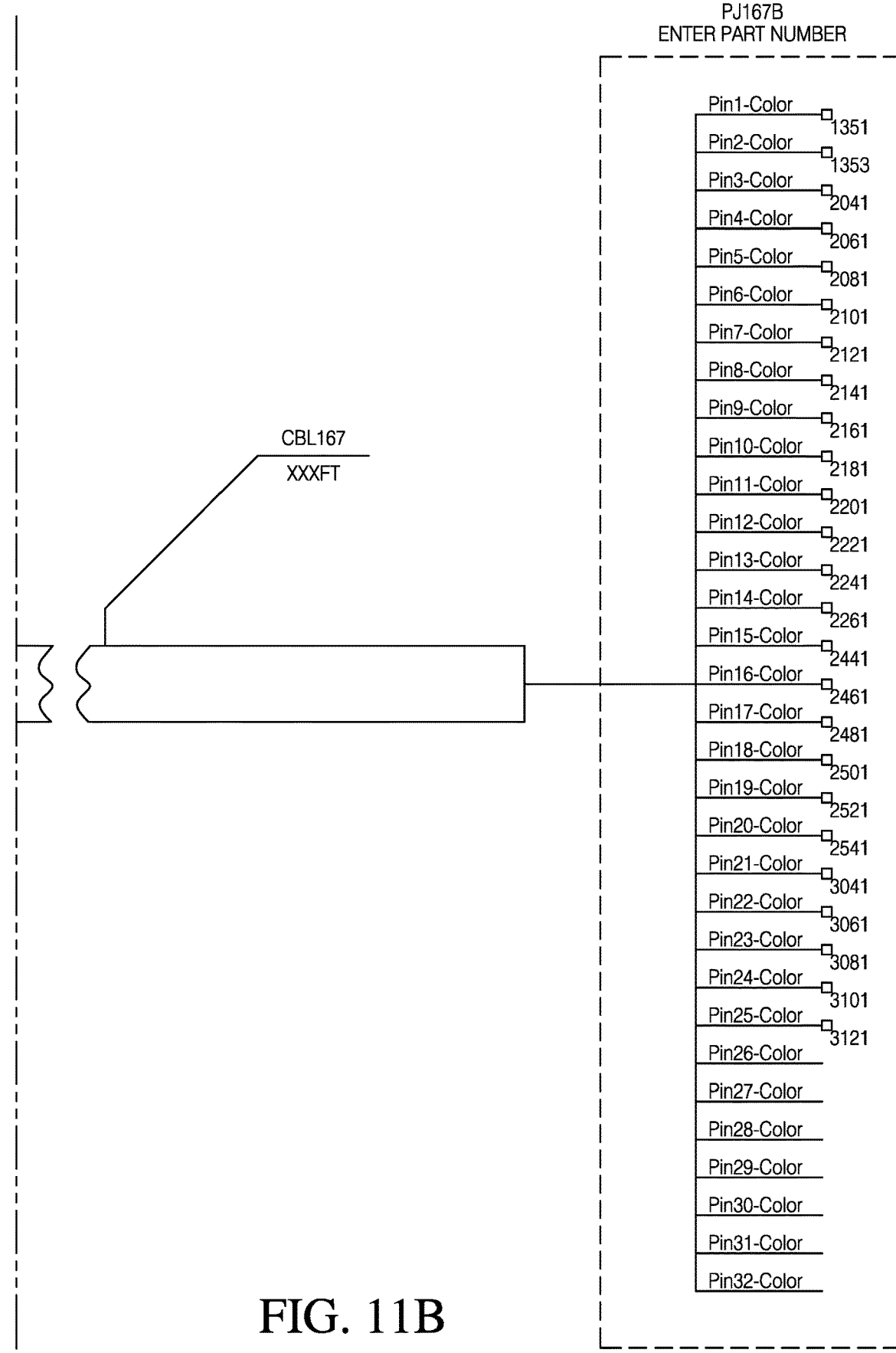

The system 100 includes a contactor box 100A and a communication box 100B, which are discussed more in FIGS. 3 and 4, respectively. It should be understood that 100A and 100B could be merged into one box or split into even more additional boxes, the amount of integration is dependent upon the specific application of the invention.

Figure 2:
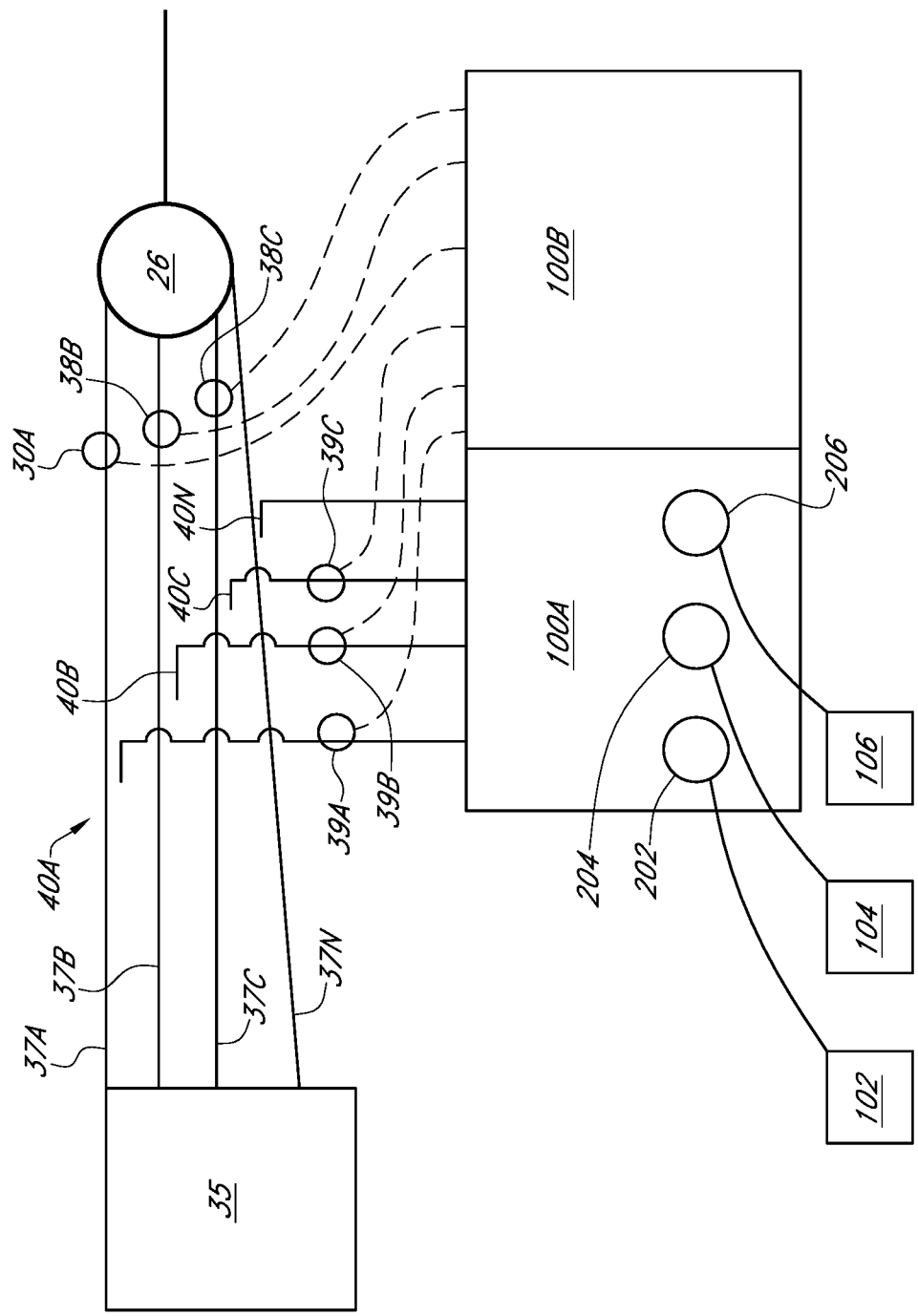
FIG. 2 is a more in-depth diagram of system in FIG. 1.

Now generally referring to FIG. 2, there is a more detailed (three phases) view into the first utility-owned dead-end electric service line 22 and the system and method of the present invention to protect it from solar produced voltage spikes.

More specifically in FIG. 1, the tap utility side 42 is shown as a single wire. However, in a more detailed view, it can be seen that this single wire actually comprises four wires; one for each of three phases and one for neutral, if the utility provided electric service is a three phase A, B, C service. In FIG. 2, this additional detail is shown, such as utility side current sensor transformer 38 (FIG. 1) is shown here as 38A, 38B, and 38C for each line for each phase, this continuously provides an instantaneous reading of the current being provided through the electric meter by the electric utility. Service line T tap 40 is actually four taps 40A, 40B, 40C and 40N on customer-owned portion of dead-end service lines 37A, 37B, 37C and 37N. No utility side current sensor 38 is needed for the neutral line 37N. Also shown is solar power control system 100, which includes contactor box 100A and communication box 100B. Between service line T tap 40 and solar power control system 100 is a set of customer side current sensor transformers 39A, 39B and 39C which are used to continuously and instantaneously determine the amount of customer generated solar power being provided on the customer-owned portions 37A-37C of the dead-end electric service line.

The general purpose of the solar power control system 100 is to regulate the amount of customer produced power that is allowed to go onto the customer-owned portion of the dead-end electric service lines 37A-37C in an attempt to eliminate the possibility that customer produced power will be provided back on to the utility-owned dead-end electric service line 22 which could produce a voltage spike and could be a source of problems for neighbors and others on the electric utility. The Solar power control system 100 regulates the amount of solar produced power that is provided to the customer-owned portion 37. If the amount of power being provided from the utility, and measured by current sensor transformers 38, drops, on any of the three lines, below a predetermine Minimum Utility Provided Percentage (MUPP), which may be 3% of the instantaneous amount being produced by the customer; then the amount of power being provided by the customer will be reduced by a predetermined amount. If, at the next reading of the current sensor transformers 38 and 39, the amount of power provided by the utility is still below the MUPP, then more of the customer generated power will be reduced. This process continues until the power provided by the utility exceeds the MUPP. The MUPP is the result of a decision, which can depend on numerous factors including maximum short term variability of electricity used by the customer, maximum short term variability in solar production, proximity to closest neighbor, type of appliances located at neighbor's and risk tolerance of the parties involved. If the MUPP is far enough above the point where no utility provided power is being consumed by the customer, then the flow of electric energy will always be in the direction from the utility to the customer, which eliminates back feeding power onto the electric service line 22 and eliminates the potential for back fed surges.

In operation, if the consumer demand drops so that the current through utility side current sensor 38 measures a current below this predetermined 3% threshold, then the amount of solar power being provided on the customer-owned service line 37 is reduced until the current through utility side current sensor 38 is above the 3% threshold. If solar produced voltage spikes are somehow appearing on and damaging other customer's equipment or appliances, then the 3% threshold may need to be increased. Conversely, if no damaging voltage spikes are occurring at the 3% level, then this level could possibly be redefined, and if appropriate, reduced even lower to allow for the customer to better utilize the solar energy it generates.

Now referring to FIG. 3, there is shown a representation of interior components of contactor box 100A, which is the portion of the present invention which includes the high voltage contactor switches for directing the proper amount of customer produced power onto the customer-owned service line 37. Contactor box 100A is coupled between customer taps 40A, 40B, and 40C and the combination of first solar panel assembly 102, second solar panel assembly 104, and third solar panel assembly 106. (FIG. 2) Three are shown as a representative number of solar panel assemblies, but fewer or more assemblies could be provided with the appropriate changes. Also shown are first contactor switch 202, second contactor switch 204, and third contactor switch 206. These contactor switches are independently controllable and may be made by Eaton Corporation, headquartered in Dublin, Ireland and having various locations in the USA, including the state of Ohio, with model number XTEC032C10A or suitable substitutes. These contactors 202, 204 and 206 are at the core of the present invention. They are controlled by first contactor switch high voltage control line 302, contactor switch high voltage control line 304, and third contactor switch control line 306, respectively. The status of these contactors is important and they are monitored with 24 volt monitor line 402, monitor line 404 and monitor line 406, respectively. The solar electric power provided to them by solar provisioning lines 502, 504 and 506, respectively, is permitted to go through lines 1031, 1032, and 1033 onto the tap customer solar producing side 46 for each phase a-c, respectively. The focus of communication box 100B (FIG. 4) can be crudely summarized as the system and method for determining what voltage is to be applied to contactor switch high voltage control lines 302, 304 and 306. In one embodiment, there may be three contactors of equal current capacity. The more contactors that are utilized to control a given output of solar power, the better the precision of approaching, but not passing, the MUPP.

In the event of a failure of any of the contactors 202, 204 and 206; neutral contactor 208 is configured to detect the failure and automatically shut down all power transmission through contactor box 100A.

Now referring to FIG. 4, there is shown a detailed representation of interior components of control box 100B.

The present invention can be programmed to switch the contactors 202, 204 and 206 on and off as desired. This switching is controlled by GE quick panel 500, which includes programmable logic. Data is provided to GE quick panel 500 through Cat 6 cable, which is an aggregation of multiple input signals including continuous instantaneous reading from utility side current sensor transformers 38 and customer side current sensor transformers 39. In one embodiment, the contactors are allowed to transmit solar produced electric power therethrough if none of the utility side current sensor transformers 38 has a reading which would result in dropping below the MUPP. However, if the panel 500 determines that one phase is below the MUPP, then one contactor will be shut down. If after shutting down one contactor 202, 204 or 206; one phase is still below MUPP, another contactor will be shut down. The incremental process continues with each sample and will end when all contactors 202, 204 and 206 are shut down or no phases indicate a current less than the MUPP.

A key function of this box 100B is to generate the proper signals on line 302, 304 and 306. The central component of this box 100B is a wiring connection panel 4000, which is used to facilitate proper connection and routing of the many wires necessary for the present invention.

The proper voltage for line 302, 304, and 306 is ultimately determined by programmable logic devices located in GE Quick Panel 500. It is in panel 500, where the logic exists and is implemented, which assesses the current levels measured by utility side current sensors 38 for each phase line. The software appendix contains details of one particular implementation.

The purpose of portion of the panel 4000 labeled "C-T RELAYS" is to connect the measured current signal lines originating from utility side current sensors 38 and ultimately providing signals to panel 500.

Also shown in FIG. 3 is a T1, T2 and a T3 for each contactor 202, 204, and 206. The purpose of these terminals is as follows: T1 is a Phase A going to line 1, T2 is phase B going to line 2 and T3 is phase C going to line 3. All terminate in a solar array combiner box of breaker panel to allow the customer to utilize the solar produced current. All solar power produced and controlled by the present invention will pass through these terminals on these contactors 202, 204, and 206.

Also shown in FIG. 4 is a neutral contactor 208, the purpose of neutral contactor 208 is as follows: Contactor 208 is a neutral isolation device. Its purpose is to shut down the entire system in one millisecond, after a fault condition, by opening the neutrals to all the combiner boxes or breaker panels of the solar array. In other words, it opens the neutral if there is a fault condition sensed by the panel 500.

In one embodiment of the present invention, the system could be configured to power a bank of batteries when the system senses that a backfeed of solar power onto the utility line is at the predetermined threshold. This could be accomplished by replacing the contactor 206, which could be a six pole contactor with normally open lines from the solar panel to the customer service line. The replacement would be a nine pole contactor, which is coupled on six poles just like the six pole contactor, except the three new poles would be normally closed and would be coupled to the battery bank. In this configuration, power could be stored during time of high solar output and low consumer consumption. The contactor 206 is chosen to have this nine pole characteristic because it is believed that if one nine-poled contactor were to be used for economic reasons, this one would be the best. However, in some situations all of the contactors could be replaced with such nine pole contactors to allow for the ability to provide for more flexibility in battery charging. For example, if more or all of the contactors 202 and 204 need to be shut down due to very low consumer consumption, more solar energy could be saved if battery banks were available.

Now referring to FIGS. 5A-11B, there is shown a detailed schematic diagram of an alternate embodiment of the present invention which includes four separate three phase contactors which are configured to allow incremental shut down of the power being provided by the customer onto the customer-owned dead-end service line 37 in four discrete increments. The addition of a fourth contactor increases the cost of the system, but in some applications the increased flexibility in operation could warrant the extra expense. In response to a determination that a minimum utility provided percentage (MUPP) is or is not being met, the panel 500 may open and close only one additional contactor at a time. In one possible embodiment of the present invention, the panel 500 and its internal programmable logic controller can be further configured with software to decide which contactor to close depending upon how far below the MUPP the system is operating. For large deviations below the MUPP, the largest capacity contactor could be shut down and for small deviations from the MUPP, the smallest contactor could be shut down. If the system is operating with less than all contactors in service and if the MUPP is being exceeded; then the panel 500 could select which contactor to switch on depending upon the amount the MUPP is being exceeded. The software appendix attached hereto provides for instructions relating to the normal or preferred configuration, but reprogramming the panel 500 to allow for more flexibility in opening and closing contactors as a function of deviation from MUPP is contemplated and believed to be implementable without experimentation and an undue amount of effort. In FIGS. 5A-11B, additional larger text labels have been added to assist in cross-referencing the call out numbers in FIGS. 1-4, which includes only three contactors for incremental shutting down of the solar electric power.

Systems with three and four three-phase contactors are shown and described, but it should be understood that many more contactors could be employed depending upon the balance between cost of contactors and cost of energy purchased from the utility.

The above described embodiments as well as the embodiments shown and or enabled by the drawings, and appendix are intended to be examples of the many possible variations of the present invention. It is intended that changes could be made to these examples without out departing from the spirit and scope of the present invention.

I claim:

1. A method of protecting a sensitive electronic equipment at a neighboring location by providing solar generated power at a customer-owned dead-end service line comprising the steps of:
providing a customer side service line downstream from a utility-owned electric meter;
measuring a consumption current through the customer side service line;
measuring a production current representative of an electric energy being provided onto said customer side service line from a source other than an electric utility;
determining if a minimum utility provided percentage (MUPP) is lacking; and
shutting down a contactor in response to a determination of a lack of sufficient consumption of electric energy through said utility-owned electric meter to maintain the MUPP.

2. The method of claim 1 wherein said step of measuring consumption current is done on each of three phases of a three-phase electric service.

3. The method of claim 2 wherein said step of determining if MUPP is lacking is done on a phase by phase basis.

4. The method of claim 3 further comprising the steps of:
providing a plurality of independently controllable contactors.

5. The method of claim 4 further comprising the steps of monitoring to detect a failure of a commanded operation of a contactor.

6. The method of claim 5 which is free of any step of aggregating current data across phases to reach a total current on all phases assessment.

7. The method of claim 1 which is free of any step of aggregating current data across phases to reach a total current on all phases assessment.

8. A system for protecting a sensitive electronic equipment at a neighboring location by providing solar generated power at a customer-owned dead-end service line comprising:
a plurality of contactors, each of which is coupled to and receives an electrical energy from a source other than through a utility-owned service dead-end line;
a plurality of utility side current sensor transformers configured to determine an instantaneous amount of an electric energy being consumed through a utility-owned electric meter;
a plurality of customer side current sensor transformers configured to determine an instantaneous amount of electric energy being produced and provided through a source other than through said utility-owned electric meter; and
a programmable logic device configured to send a signal to shut down transmission of energy, from said source other than through said utility-owned electric meter, onto said customer-owned dead-end service line if a reading on one of said plurality of utility side current sensor transformers indicates that a MUPP is lacking.

9. The system of claim 8 wherein said programmable logic device is configured to perform a determination of compliance with the MUPP on a phase by phase basis across three phase of electrical energy through said utility-owned service dead-end line and from said source other than through said utility-owned electric meter.

10. The system of claim 9 wherein said source other than through said utility-owned electric meter includes a solar panel.

11. The system of claim 8 wherein each of said plurality of contactors are configured to report an operational status of one of said plurality of contactors.

12. The system of claim 11 further comprising a neutral contactor configured to shut down all power transmission to said customer-owned dead-end service line when said operational status of one of said plurality of contactors is inconsistent with a commanded status.

13. The system of claim 12 wherein said commanded status is commanded to each of said plurality of contactors through a contactor switch high voltage control lines with a command voltage of between 100 volts and 140 volts.

14. A system for reducing surges of energy on an electric utility line which originates from sources on a customer-owned dead-end service line comprising:

means for incrementally shutting down transmission of power originating from a source other than through a utility-owned electric meter;

means for determining an instantaneous current consumed through a utility-owned service line;

means for determining an instantaneous current produced by said source other than through a utility-owned electric meter; and means for calculating if said instantaneous current consumed through a utility-owned service line divided by said instantaneous current produced by said source other than through a utility-owned electric meter, exceeds a minimum utility provided percentage (MUPP).

15. The system of claim 14 where said means for incrementally shutting down transmission of power comprises a plurality of three phase contactors.

16. The system of claim 15 where said means for determining an instantaneous current consumed through a utility-owned service line comprises a plurality of current sensor transformers disposed about each wire of a three phase service provided by an electric utility.

17. The system of claim 16 wherein said means for calculating comprises a programmable logic controller.

18. The system of claim 17 further comprising a means for determining a failure among said plurality of three phase contactors.

19. The system of claim 18 further comprising a means for terminating transmission of electrical power produced by said source other than through a utility-owned electric meter.

20. The system of claim 19 wherein said means for terminating transmission comprises a neutral contactor.

* * * * *